US011257542B2

(12) United States Patent
Wu (10) Patent No.: US 11,257,542 B2
(45) Date of Patent: Feb. 22, 2022

(54) MEMORY DRIVING DEVICE

(71) Applicants: Jiangsu Advanced Memory Technology Co., Ltd., Jiangsu (CN); Jiangsu Advanced Memory Semiconductor Co., Ltd., Jiangsu (CN); ALTO MEMORY TECHNOLOGY CORPORATION, Hsinchu County (TW)

(72) Inventor: Jui-Jen Wu, Hsinchu County (TW)

(73) Assignees: JIANGSU ADVANCED MEMORY TECHNOLOGY CO., LTD., Jiangsu (CN); JIANGSU ADVANCED MEMORY SEMICONDUCTOR CO., LTD., Hsinchu County (TW); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/255,993

(22) PCT Filed: Jun. 27, 2018

(86) PCT No.: PCT/CN2018/092994
§ 371 (c)(1),
(2) Date: Dec. 23, 2020

(87) PCT Pub. No.: WO2020/000230
PCT Pub. Date: Jan. 2, 2020

(65) Prior Publication Data
US 2021/0312980 A1    Oct. 7, 2021

(51) Int. Cl.
*G11C 7/00*     (2006.01)
*G11C 13/00*    (2006.01)

(52) U.S. Cl.
CPC ...... *G11C 13/0021* (2013.01); *G11C 13/0004* (2013.01)

(58) Field of Classification Search
CPC .................................................. G11C 13/0021
(Continued)

(56) References Cited

U.S. PATENT DOCUMENTS 6,335,643 B1   1/2002 Ono
8,259,522 B1   9/2012 Dastidar et al.
(Continued)

FOREIGN PATENT DOCUMENTS

CN   104821179 A   8/2015
CN   105304116 A   2/2016

*Primary Examiner* — Hoai V Ho
(74) *Attorney, Agent, or Firm* — CKC & Partners Co., LLC (57) ABSTRACT

A memory driving device, comprising a switch, a voltage setting circuit, and a bias control circuit. The switch is coupled to a memory at a node. The voltage setting circuit is coupled to the switch and configured to provide a set signal during a first period to turn on the switch, so as to generate current flowing through the switch to the memory unit. The bias control circuit is respectively coupled to the switch and the node, and, during a second period, continuously provides a bias signal to control the switch so as to adaptively adjust a value of the setting current of the switch. The configuration setting terminal is coupled to the voltage setting circuit and the bias control circuit to control the first and the second period.

13 Claims, 10 Drawing Sheets

(58) Field of Classification Search
USPC .......................................................... 365/226
See application file for complete search history.

(56) References Cited

U.S. PATENT DOCUMENTS 10,665,296 B1 * 5/2020 Wu ...................... G11C 13/003
10,964,383 B2 * 3/2021 Wu .......................... G11C 7/16

* cited by examiner

MEMORY DRIVING DEVICE

BACKGROUND

Field of Invention

The present disclosure relates to a memory. More particularly, the present disclosure relates to a memory drive device.

Description of Related Art

The conventional memory technologies, such as dynamic random access memory (DRAM) and static random access memory (SRAM), etc., are becoming more mature, thus facing the physical limit of scale. Therefore, developing new memory technologies to meet future memory applications is now an important research subject in the related fields.

In memory technologies, the memristive memory includes the phase change memory (PCM), which can change the resistance value of the element by way of the crystal phase change of its material to store information by utilizing the resistance value change. When the material in the memory element is in a crystalline state, it exhibits a low resistance value. On the contrary, when it is in an amorphous state, it exhibits a high resistance value. As a result, data such as "1" or "0" is stored.

For example, the memristive memory needs to perform a setting (SET) or resetting (RESET) operation through a drive voltage/current correspondingly. However, because the characteristics of each phase change memory differ, the conventional memory drive circuit can not adaptively adjust the voltage/current of the driving operation in response to each phase change memory. Hence, how to design a drive circuit suitable for the memristive memory to adjust the voltage/current of the driving operation in response to the characteristics of each phase change memory is one of the current important research and development subjects, which has also become a target that needs to be improved in the related fields.

SUMMARY

The summary aims to provide a brief description of the disclosure so that readers can understand the disclosure fundamentally. The summary does not describe the disclosure completely, and does not intend to specify the important/critical elements of the embodiments of the present disclosure or limit the scope of the present disclosure.

One objective of the present disclosure is to provide a memory drive device to resolve the problems that exist in the prior art. The solution is as follows.

A memory drive device is provided. The memory drive device comprises a first switch, a voltage setting circuit, a bias control circuit, and a configuration setting terminal. The first switch is coupled to a memory unit at a first node. The voltage setting circuit is coupled to the first switch, and is configured to provide a setting signal to turn on the first switch during a first period so as to generate a setting current flowing to the memory unit through the first switch. The bias control circuit is respectively coupled to the first switch and the first node. The bias control circuit continuously detects a voltage at the first node, during a second period, and continuously provides a bias signal to control the first switch so as to adaptively adjust a value of the setting current of the first switch. The configuration setting terminal is coupled to the voltage setting circuit and the bias control circuit so as to control the first period and the second period.

The bias control circuit comprises a variable resistor element, a voltage amplifier, and a resistor/capacitor element. The variable resistor element and the resistor/capacitor element are connected in series. The bias signal is generated at a node where the variable resistor element and the resistor/capacitor element are connected in series to control the first switch. The voltage amplifier is coupled to the first switch and the memory unit, and is configured to detect a first voltage generated in a current path of the setting current to provide a second voltage to the variable resistor element, so as to adjust a resistance value of the variable resistor element to adjust a value of the bias signal correspondingly. As a result, the memory drive device according to the embodiment of the present disclosure can adaptively adjust the voltage of the driving operation of each of the phase change memories based on the different characteristics of the each of the phase change memories.

Many of the attendant features will be more readily appreciated as the same becomes better understood by reference to the following detailed description considered in connection with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the present disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

As used herein, "couple" refers to direct physical contact or electrical contact or indirect physical contact or electrical contact between two or more elements. Or it can also refer to reciprocal operations or actions between two or more elements.

Figure 1:
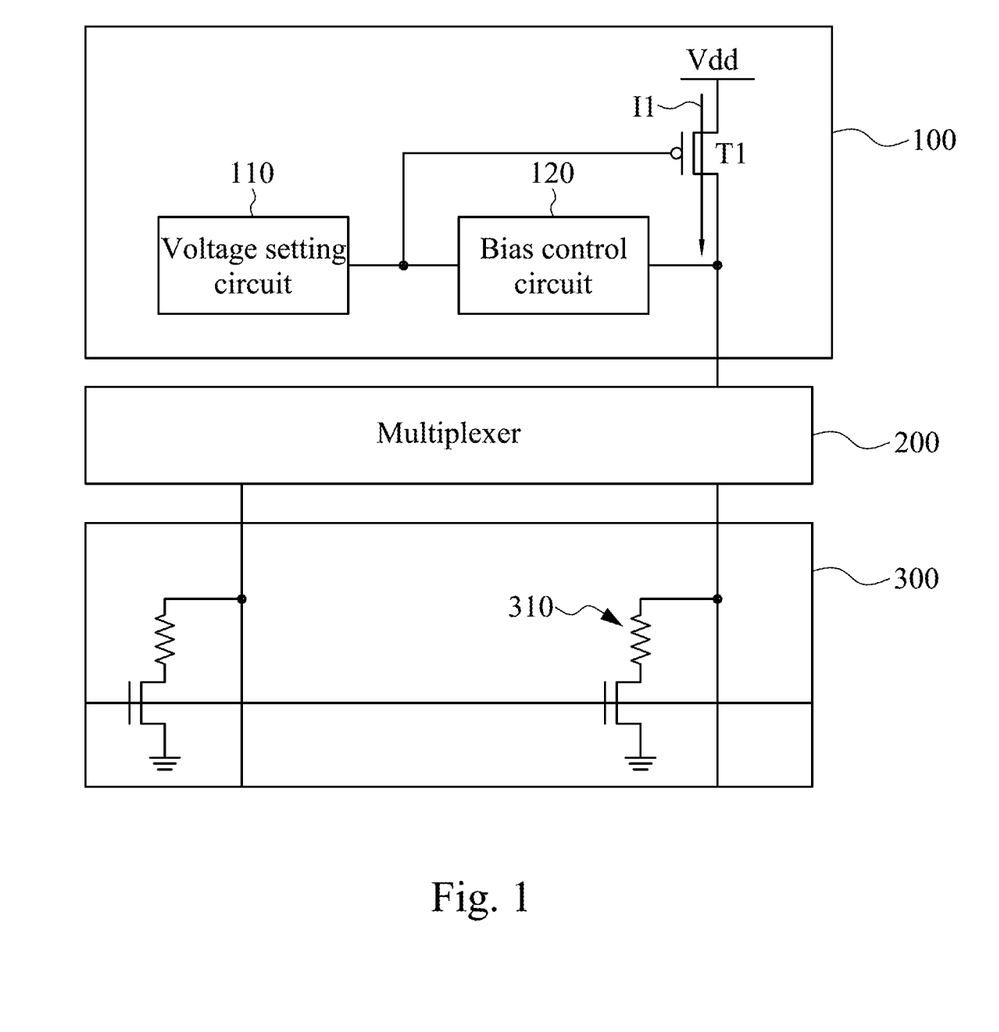
FIG. 1 depicts a schematic diagram of circuit blocks of a memory according to one embodiment of the present disclosure.

FIG. 1 depicts a schematic diagram of circuit blocks of a memory according to one embodiment of the present disclosure. As shown in the figure, the memory includes a memory drive device 100, a multiplexer 200, and a memory array 300.

A description is provided with reference to FIG. 1. The memory drive device 100 includes a switch T1, a voltage setting circuit 110, and a bias control circuit 120. The memory array 300 includes a plurality of memory units 310.

As for the connection relationships, the switch T1 is coupled to the memory array 300. The voltage setting circuit 110 is coupled to the switch T1. The bias control circuit 120 is coupled to the voltage setting circuit 110, the switch T1, and the memory array 300. In one embodiment, the memory drive device 100 is configured to drive memory units (such as the memory units 310) in the memory array 300. A memory unit to be driven by the memory drive device 100 can be selected through the multiplexer 200. Here, the driving method of the memory drive device 100 is illustrated by taking the memory unit 310 as an example. In another embodiment, the switch T1 can be coupled to the memory unit 310 of the memory array 300 through the multiplexer 200, and then the voltage setting circuit 110 and the bias control circuit 120 operate cooperatively to control the switch T1 so as to drive the memory unit 310 of the memory array 300. Relevant operations are provided in detail in the following description.

As for the operations, the voltage setting circuit 110 first provides a setting signal to turn on the switch T1 so as to generate a current I1 flowing to the memory unit 310 through the switch T1. After that, the bias control circuit 120 provides a bias signal to the switch T1 based on a magnitude of the current I1 and a resistance value of the memory unit 310 to control turning on and turning off of the switch T1 so as to adaptively adjust the current I1. For example, the memory unit 310 may be a phase change memory unit, which may be realized by using a material, such as a chalcogenide, etc. However, the present disclosure is not limited in this regard. Under different operating temperatures, the memory unit 310 has different crystalline states to equivalently store different data. First of all, when the voltage setting circuit 110 turns on the switch T1, the current I1 is generated and flows towards the memory unit 310. At this time, a temperature of the memory unit 310 rises to exhibits a crystalline state. Under this condition, the memory unit 310 has a low resistance value.

In addition, the voltage setting circuit 110 stops providing the setting signal to the switch T1. At this time, the bias control circuit 120 provides the bias signal to the switch T1 based on a voltage value of a product of the current I1 and an internal resistance in the memory unit 310 so as to control the switch T1. Since the magnitude of the current I1 correlates with the resistance value of the memory unit 310, the configuration method according to the present disclosure can track a change of the current I1 caused by a change of the resistance value of the memory unit 310 in real time, and then the bias control circuit 120 adaptively adjusts a control voltage of the switch T1 for driving based on a magnitude of the product of the current I1 and the current internal resistance in the memory unit 310 so as to adjust the current I1. It is thus understood that the memory drive device 100 according to the present disclosure can adaptively adjust a voltage/current of a driving operation of each of the memory units based on characteristics of the each of the memory units.

The circuit shown in FIG. 1 is merely used to illustrate one of the implementation methods of the present disclosure by taking an example, and is not intended to limit the present disclosure. For example, the switch T1 in FIG. 1 adopts a P-type metal-oxide-semiconductor field-effect transistor (P-type MOSFET). However, the present disclosure may adopt an N-type metal-oxide-semiconductor field-effect transistor (N-type MOSFET) depending on practical needs. Additionally, some other type of switch may be adopted depending on practical needs.

Figure 2A:
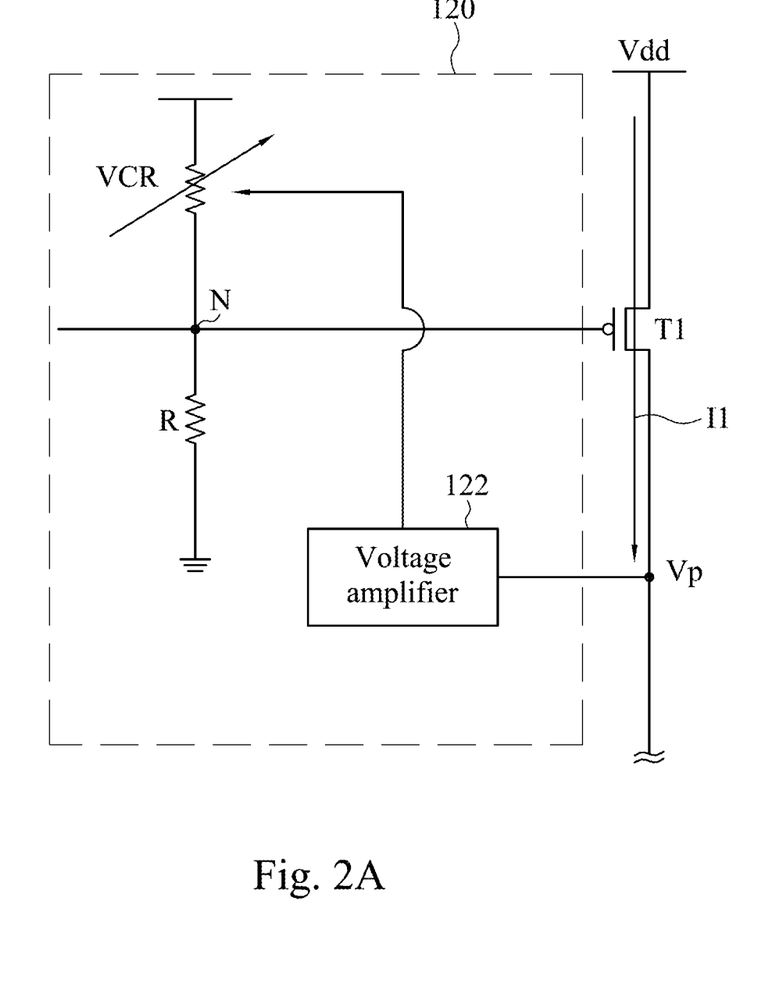
FIG. 2A depicts a schematic diagram of a bias control circuit of the memory shown in FIG. 1 according to one embodiment of the present disclosure.

FIG. 2A depicts a schematic diagram of a bias control circuit 120 of the memory shown in FIG. 1 according to one embodiment of the present disclosure. As shown in the figure, the bias control circuit 120 includes a variable resistor element VCR, a resistor R, and a voltage amplifier 122. As for the connection relationships, the variable resistor element VCR includes three terminals. One of the terminals is configured to receive a power supply voltage Vdd. Another one of the terminals and a control terminal of the switch T1 are coupled to a node N. A control terminal of the variable resistor element VCR is configured to receive a control signal from the voltage amplifier 122 to adjust its resistance value. One terminal of the resistor R is coupled to the node N. Another terminal of the resistor R is grounded. An input terminal of the voltage amplifier 122 is coupled to a current output terminal of the switch T1 and the memory unit 310 shown in FIG. 1, and is configured to sense a voltage value at the current output terminal of the switch T1.

When the voltage setting circuit 110 shown in FIG. 1 provides the setting signal to turn on the switch T1, the current I1 flows towards the memory unit 310. At this time, an initial resistance value of the variable resistor element VCR is infinite. Therefore, the power supply voltage Vdd can not be provided to the node N through the variable resistor element VCR. A voltage value at the node N is zero.

When the voltage setting circuit 110 stops providing the setting signal to the switch T1, the voltage amplifier 122 is configured to detect a voltage Vp generated in a current path to provide an amplified voltage to the variable resistor element VCR. At this stage, the resistance value of the variable resistor element VCR gradually decreases. The power supply voltage Vdd is divided by the variable resistor element VCR and the resistor R to generate a bias voltage at the node N. This bias voltage gradually increases, the switch T1 is gradually turned off, and the current I1 is gradually weakened. Finally, the switch T1 is turned off.

Figure 2B:
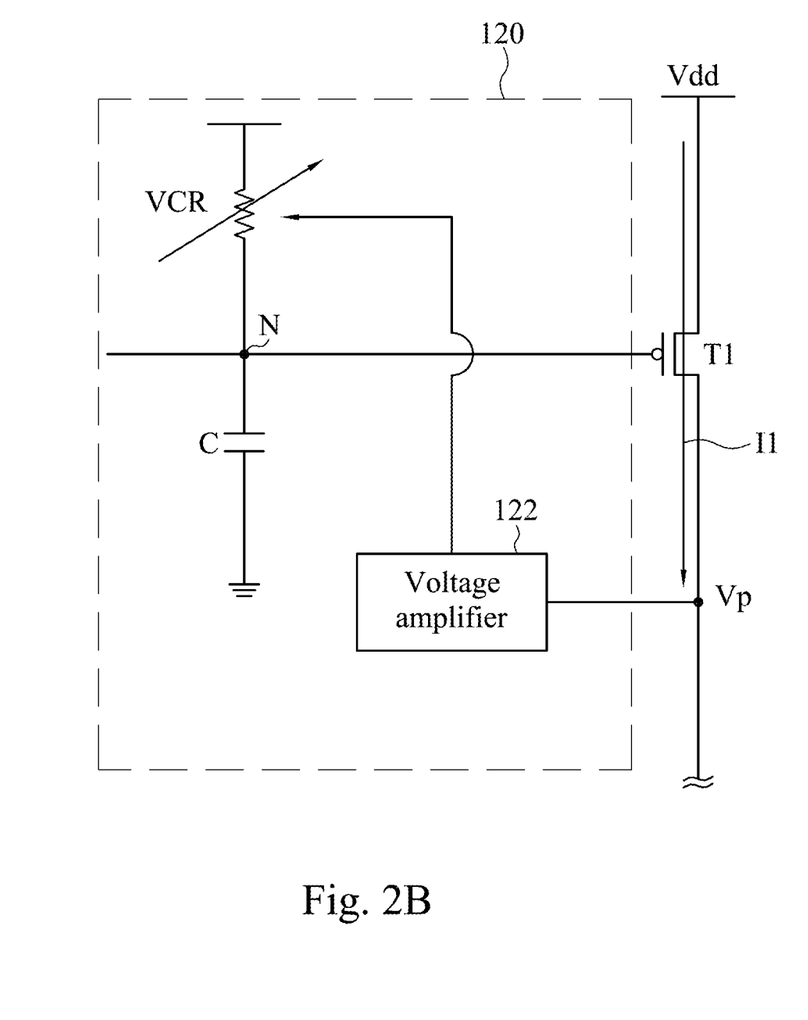
FIG. 2B depicts a schematic diagram of a bias control circuit of the memory shown in FIG. 1 according to another embodiment of the present disclosure.

FIG. 2B depicts a schematic diagram of the bias control circuit 120 of the memory shown in FIG. 1 according to another embodiment of the present disclosure. As shown in the figure, the bias control circuit 120 includes the variable resistor element VCR, a capacitor C, and the voltage amplifier 122. It is noted that the bias control circuit 120 of FIG. 2B differs from the bias control circuit 120 of FIG. 2A in that the capacitor C rather than the resistor R is adopted. One terminal of the capacitor C of FIG. 2B is coupled to the node N. Another terminal of the capacitor C is grounded.

When the voltage setting circuit 110 shown in FIG. 1 provides the setting signal to turn on the switch T1, the current I1 flows towards the memory unit 310. At this time, the initial resistance value of the variable resistor element VCR is infinite. Therefore, the power supply voltage Vdd can not be provided to the node N through the variable resistor element VCR. The voltage value at the node N is zero. The switch T1 is completely turned on at this time.

When the voltage setting circuit 110 stops providing the setting signal to the switch T1, the voltage amplifier 122 is configured to detect the voltage Vp generated in the current path to provide the amplified voltage to the variable resistor element VCR. At this stage, the resistance value of the variable resistor element VCR gradually decreases. The power supply voltage Vdd can charge the capacitor C through the variable resistor element VCR to generate the bias voltage at the node N. This bias voltage gradually increases, the switch T1 is gradually turned off, and the current I1 is gradually weakened. Finally, the switch T1 is turned off.

Figure 3:
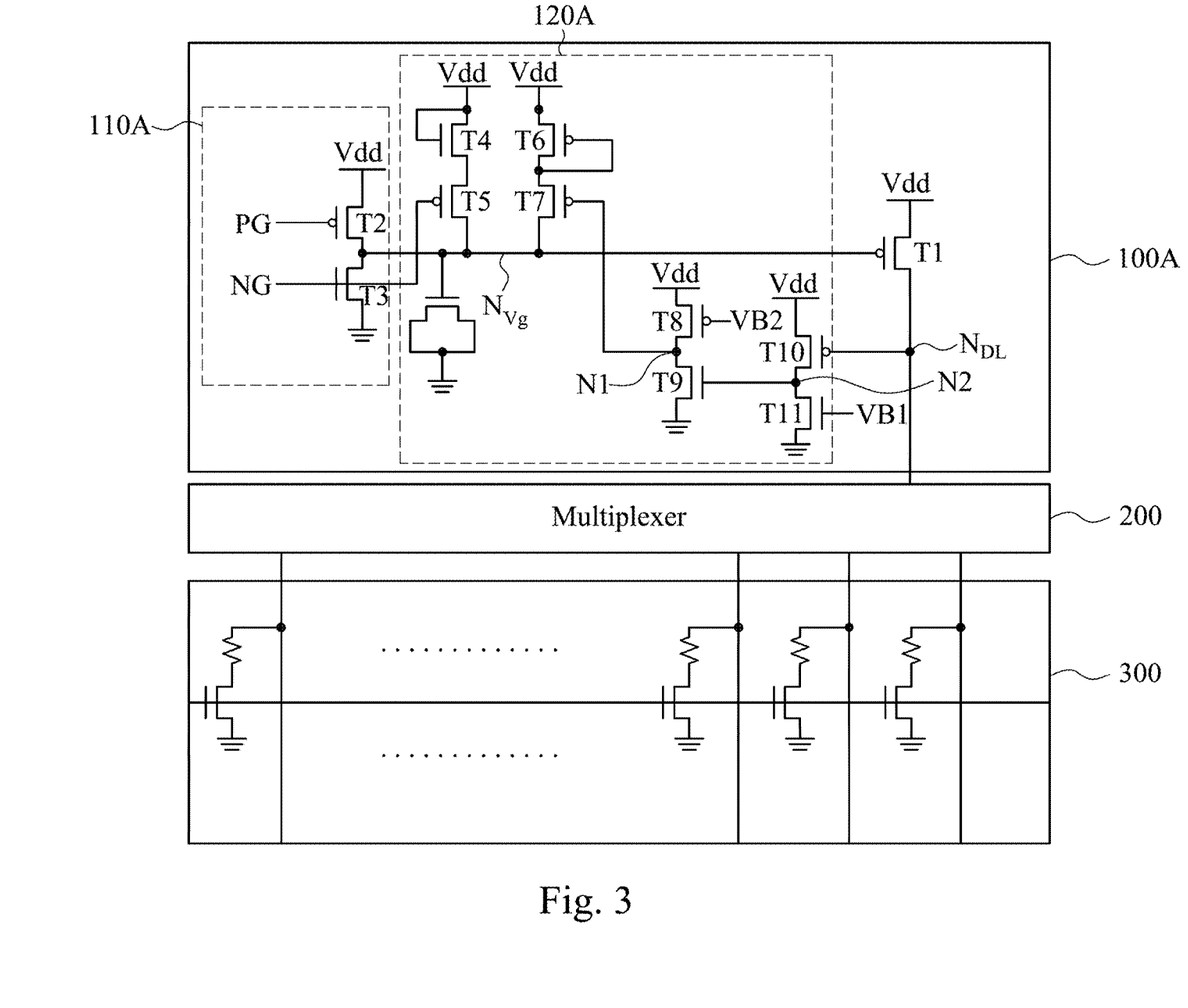
FIG. 3 depicts a schematic circuit diagram of the memory shown in FIG. 1 according to one embodiment of the present disclosure.

FIG. 3 depicts a schematic circuit diagram of the memory shown in FIG. 1 according to one embodiment of the present disclosure. A first terminal of the switch T1 is configured to receive the power supply voltage Vdd. A second terminal of the switch T1 is coupled to the memory array 300 through the multiplexer 200. A circuit 110A shown in FIG. 3 is equivalent to the voltage setting circuit 110 of FIG. 1, and a circuit 120A is equivalent to the bias control circuit 120 of FIG. 1.

A description is provided with reference to FIG. 3. The voltage setting circuit 110 includes switches T2, T3, and the bias control circuit 120A includes switches T4 to T11. The switches T4 to T11 may be one embodiment of the variable resistor element. The switches T8 to T11 may be one embodiment of the voltage amplifier 122. As for the connection/operational relationships, a first terminal of the switch T2 is configured to receive the power supply voltage Vdd. A control terminal of the switch T2 is configured to receive a signal PG. A second terminal of the switch T2 is coupled to the control terminal of the switch T1. A first terminal of the switch T3 is coupled to the second terminal of the switch T2. A control terminal of the switch T3 is configured to receive a signal NG. A second terminal of the switch T3 is coupled to a ground terminal. An output terminal N1 of the voltage amplifier 122 outputs the control signal to control the resistance value of the variable resistor element.

In addition to that, the switch T4 is an NMOS transistor by taking the present embodiment as an example. A first terminal of the switch T4 is configured to receive the power supply voltage Vdd. A control terminal of the switch T4 is coupled to the first terminal of the switch T4. In this manner, the switch T4 is in a conducting state. A first terminal of the switch T5 is coupled to a second terminal of the switch T4. A control terminal of the switch T5 is configured to receive the signal NG. A second terminal of the switch T5 is coupled to the control terminal of the switch T1. That is to say, the signal NG controls turning on and turning off of the switch T5. The switch T6 is a PMOS transistor by taking the present embodiment as an example. A first terminal of the switch T6 is configured to receive the power supply voltage Vdd. A second terminal of the switch T6 is coupled to a control terminal of the switch T6. In this manner, the switch T6 is in the conducting state. A first terminal of the switch T7 is coupled to the second terminal of the switch T6. A second terminal of the switch T7 is coupled to the control terminal of the switch T1. A control terminal of the switch T7 is coupled to the output terminal N1 of the voltage amplifier 122. That is to say, the voltage amplifier 122 controls turning on and turning off of the switch T7.

In addition, a first terminal of the switch T8 is configured to receive the power supply voltage Vdd. A control terminal of the switch T8 is configured to receive a bias voltage VB2. The bias voltage VB2 is a stable direct current (DC) voltage, which can be generated by an internal circuit of a memory chip or supplied from an external of a chip. A first terminal of the switch T9 and a second terminal of the switch T8 are coupled at the node N1. The above node N1 is coupled to the control terminal of the switch T7. A second terminal of the switch T9 is coupled to the ground terminal. A first terminal of the switch T10 is configured to receive the power supply voltage Vdd. A control terminal of the switch T10 is coupled to the second terminal of the switch T1. A first terminal of the switch T11 and a second terminal of the switch T10 are coupled at a node N2. The above node N2 is coupled to a control terminal of the switch T9. A control terminal of the switch T11 is coupled to a bias voltage VB1. The bias voltage VB1 is a stable DC voltage, which can be generated by an internal circuit of the memory chip or supplied from the external of the chip. The circuit shown in FIG. 3 is merely used to illustrate one of the implementation methods of the present disclosure by taking an example, and is not intended to limit the present disclosure. For example, each of the switches T1 to T11 in FIG. 3 may adopt a P-type or an N-type MOSFET depending on practical needs, or some other type of switch may be adopted depending on practical needs.

Figure 4:
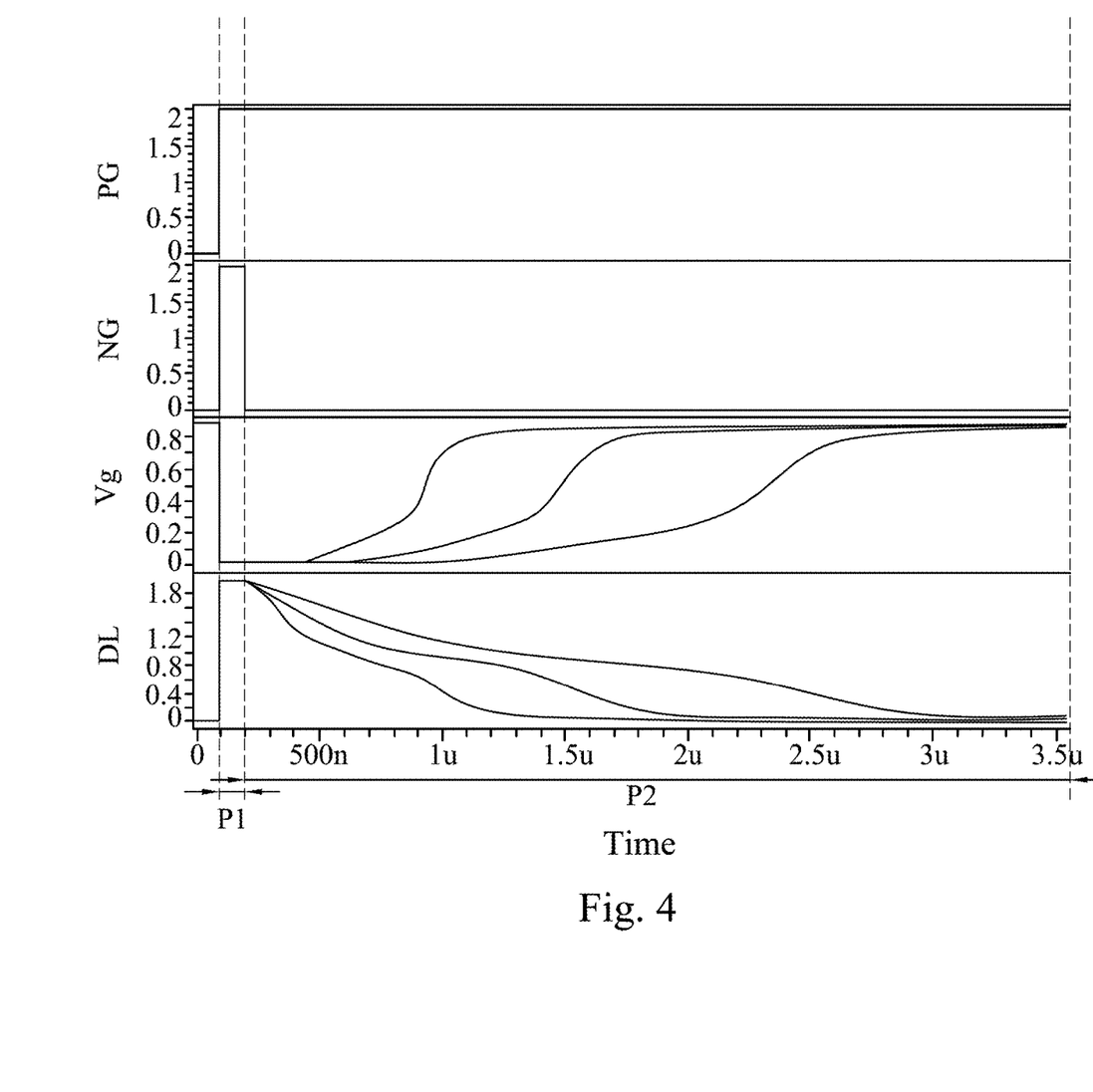
FIG. 4 depicts a schematic diagram of control waveforms of the memory shown in FIG. 3 according to one embodiment of the present disclosure.

FIG. 4 depicts a schematic diagram of control waveforms of the memory shown in FIG. 3 according to one embodiment of the present disclosure. As shown in the figure, during a period P1, the signal PG and the signal NG are both high-level signals. During a period P2, the signal PG is maintained as the high-level signal, but the signal NG turns to be a low-level signal. Through the level alternations of the above signals, a memory drive circuit 100A outputs different operating voltages/currents. A detailed illustration is provided with reference to the circuits in the following description.

Figure 5:
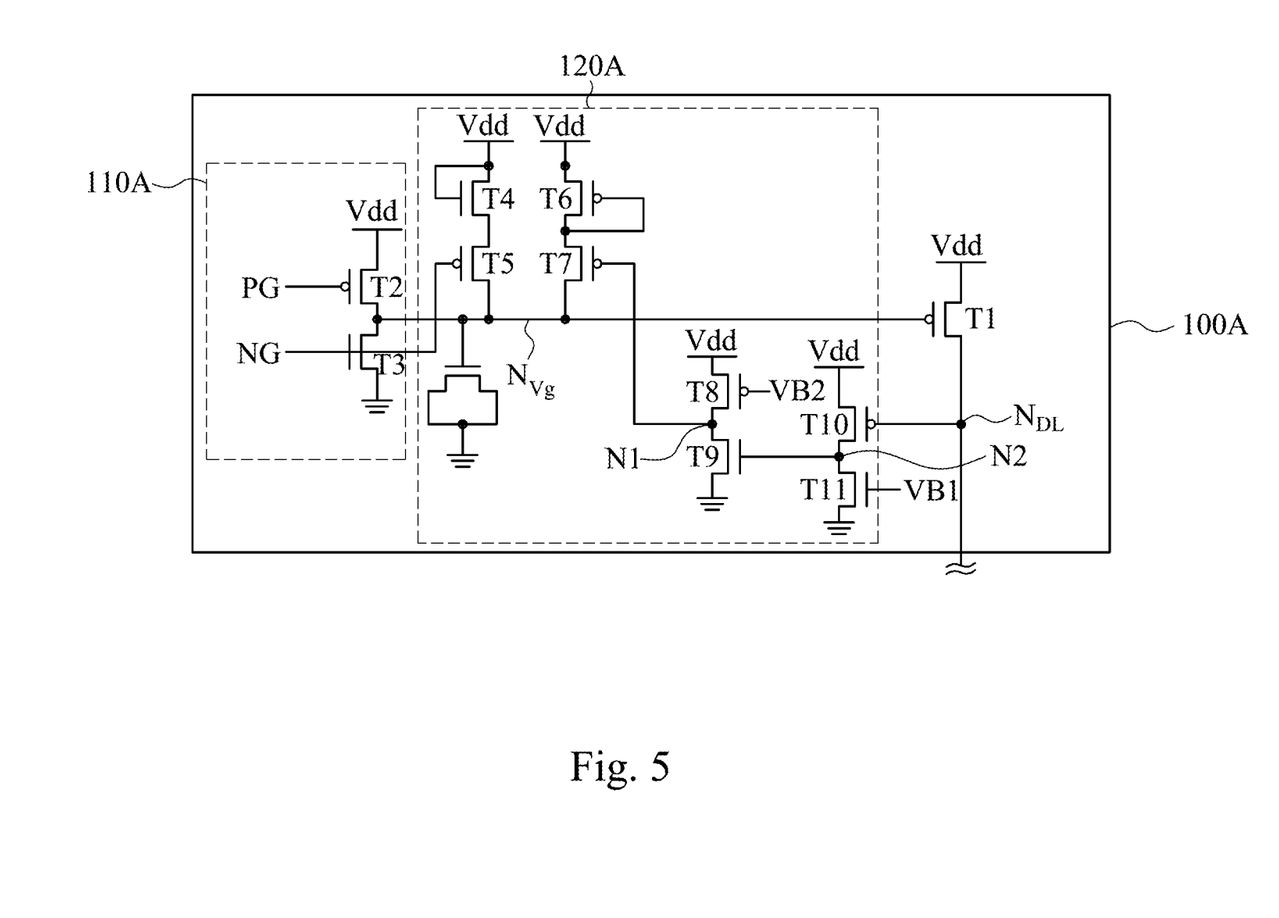
FIG. 5 depicts a schematic diagram of operations of the memory shown in FIG. 3 according to one embodiment of the present disclosure.

FIG. 5 depicts a schematic diagram of operations of the memory shown in FIG. 3 according to one embodiment of the present disclosure. A description is provided with reference to FIG. 4 and FIG. 5 to facilitate understanding. During the period P1, the voltage setting circuit 110A performs setting on the memory array 300. At this time, the signal PG and the signal NG are both at a high level, the switches T2, T5 are thus turned off. The switch T3 is turned on to pull down a voltage at a node NVg, so that a voltage Vg at the node NVg is the low-level voltage. As a result, the switch T1 is completely turned on. A product of a current of the switch T1 that is completely turned on and an internal resistance in the memory unit renders a voltage DL at a node NDL to be at the high level. The switch T10 is thus turned off. The switch T11 is turned on by the high-level bias voltage VB1 so as to pull down a voltage at the node N2. The voltage at the node N2 is at a low level. The switch T9 is therefore turned off. The transistor T8 is turned on by the low-level bias voltage VB2. The power supply voltage Vdd is provided to the node N1 so that a voltage at the node N1 is at the high level. The switch T7 is thus turned off. As a result, during the period P1, the switch T3 is turned on to pull down the voltage at the node NVg, and no other power supply voltage Vdd is provided to the node NVg. Accordingly, the voltage Vg at the node NVg is the low-level voltage, and the switch T1 is completely turned on.

Figure 6:
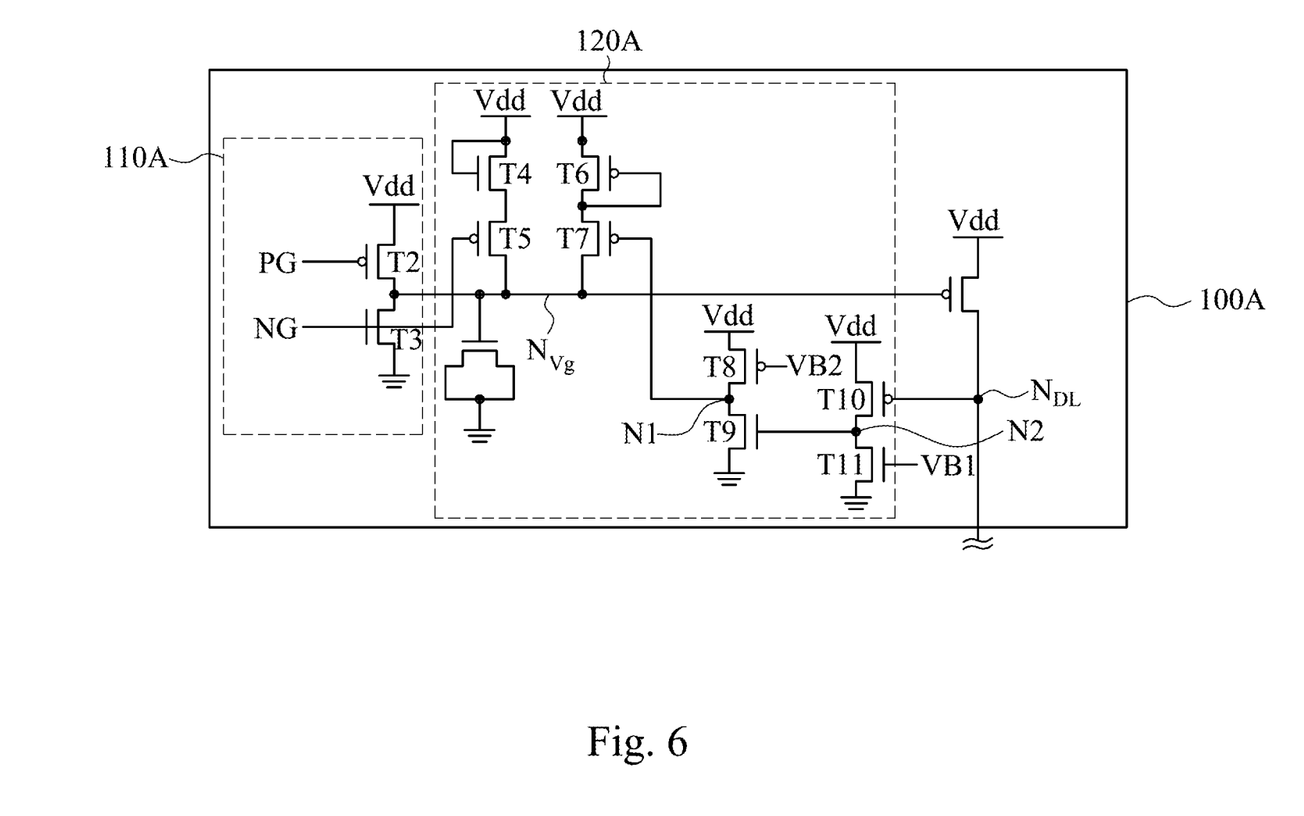
FIG. 6 depicts a schematic diagram of operations of the memory shown in FIG. 3 according to one embodiment of the present disclosure.

FIG. 6 depicts a schematic diagram of operations of the memory shown in FIG. 3 according to one embodiment of the present disclosure. A description is provided with reference to FIG. 4 and FIG. 6 to facilitate understanding. During the period P2, the bias control circuit 120A slowly reduces a voltage/current supplied to the memory array 300 after the memory array 300 is set to avoid that a resistance value of the memory array 300 is pulled up again. At this time, the signal PG is maintained at the high level, and the signal NG turns to be at the low level. The switches T2, T3 are thus turned off. The switch T5 is turned on. The power supply voltage Vdd is provided to the node NVg through the switches T4, T5. The voltage at the node NVg thus gradually rises. At this time, the switch T1 is gradually turned off to cause the current I1 to gradually decrease and the voltage DL at the node NDL to gradually decrease too. Therefore, the switch T10 is gradually turned on. The power supply voltage Vdd is provided to the node N2 through the switch T10, so that the voltage at the node N2 gradually rises. The switch T9 is thus gradually turned on. The voltage at the node N1 gradually decreases, and the switch T7 is also gradually turned on accordingly. At this time, the power supply voltage Vdd is supplied to the node NVg through a current path provided by the switches T6, T7, which further enhances the voltage rise at the node NVg. The switch T1 is therefore gradually turned off based on a state of the memory unit, the current I1 is also gradually decreased accordingly, and the voltage DL at the node NDL is also gradually decreased.

A description is provided with reference to the voltage waveforms of FIG. 4. The voltage DL at the node NDL is adjusted at any time based on a state of the memory array 300. As a result, the memory drive device 100A according to the present disclosure can indeed adaptively adjust the voltage/current of the driving operation of each of the memory units based on the characteristics of the each of the memory units.

Figure 7:
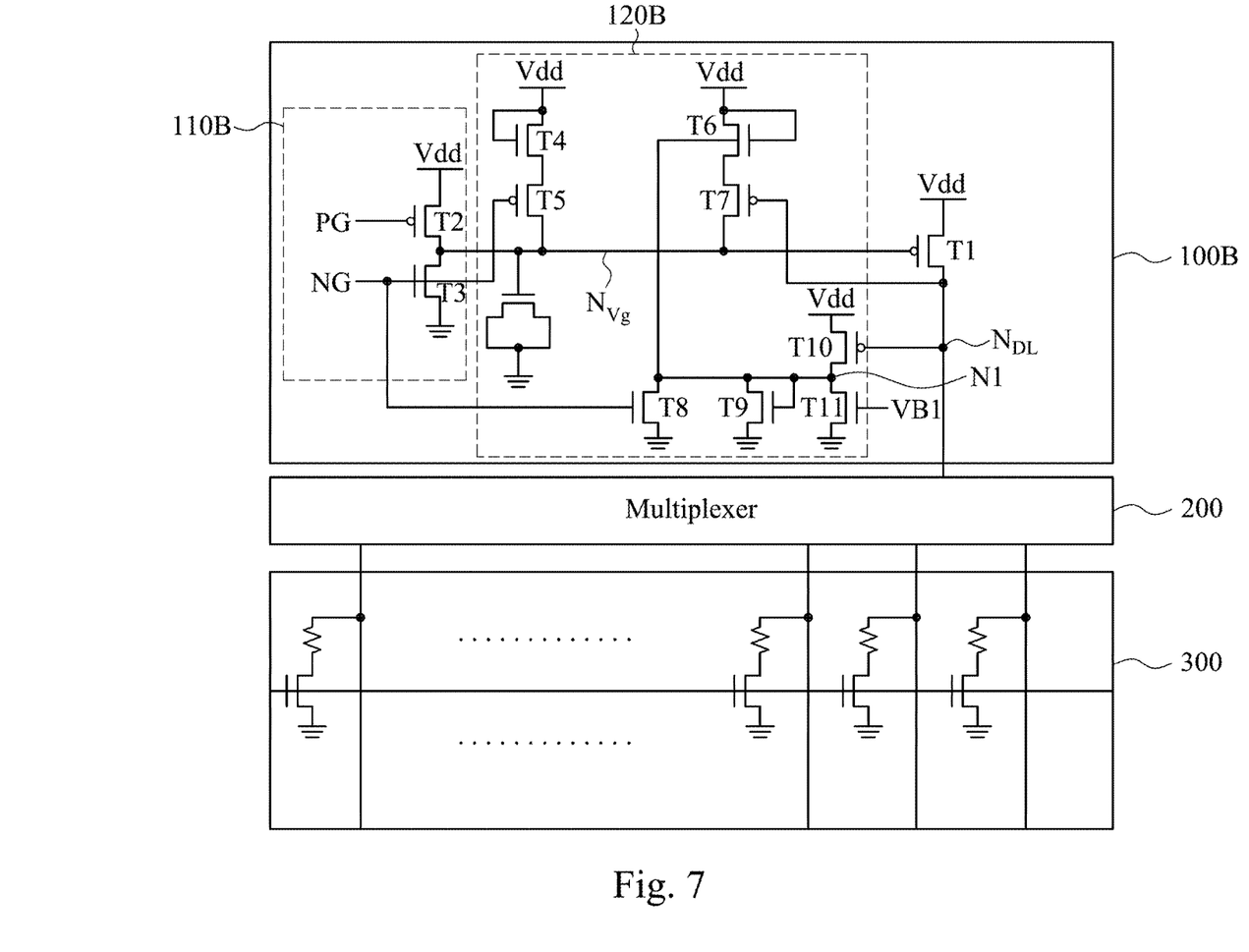
FIG. 7 depicts a schematic circuit diagram of the memory shown in FIG. 1 according to another embodiment of the present disclosure.

FIG. 7 depicts a schematic circuit diagram of the memory shown in FIG. 1 according to another embodiment of the present disclosure. As shown in the figure, a first terminal of the switch T1 is configured to receive the power supply voltage Vdd. A second terminal of the switch T1 is coupled to the memory array 300 through the multiplexer 200. A circuit 1106 shown in FIG. 7 is equivalent to the voltage setting circuit 110 of FIG. 1, and a circuit 1206 is equivalent to the bias control circuit 120 of FIG. 1.

It is noted that a structure of the voltage setting circuit 1106 of FIG. 7 is similar to a structure of the voltage setting circuit 110A of FIG. 3. To simplify matters, a description in this regard is not provided.

A description is provided with reference to FIG. 7. The bias control circuit 120B includes switches T4 to T11. The switches T4 to T11 may be one embodiment of the variable resistor element. The switches T8 to T11 may be one embodiment of the voltage amplifier 122. As for the connection/operational relationships, the switch T4 is an NMOS transistor by taking the present embodiment as an example. A first terminal of the switch T4 is configured to receive the power supply voltage Vdd. A control terminal of the switch T4 is coupled to the first terminal of the switch T4. In this manner, the switch T4 is in a conducting state. A first terminal of the switch T5 is coupled to a second terminal of the switch T4. A control terminal of the switch T5 is configured to receive a signal NG. A second terminal of the switch T5 is coupled to a control terminal of the switch T1. The switch T6 is an NMOS transistor by taking the present embodiment as an example. A first terminal of the switch T6 is configured to receive the power supply voltage Vdd. A control terminal of the switch T6 is coupled to the first terminal of the switch T6. In this manner, the switch T6 is in the conducting state. A first terminal of the switch T7 is coupled to a second terminal of the switch T6. A control terminal of the switch T7 is coupled to a second terminal of the switch T1. A second terminal of the switch T7 is coupled to the control terminal of the switch T1.

Additionally, a first terminal of the switch T8 is coupled to a base of the switch T6. A control terminal of the switch T8 is configured to receive the signal NG. A second terminal of the switch T8 is coupled to a ground terminal. A first terminal of the switch T9 is coupled to the first terminal of the switch T8. A control terminal of the switch T9 is coupled to the first terminal of the switch T9. A second terminal of the switch T9 is coupled to the ground terminal. A first terminal of the switch T10 is configured to receive the power supply voltage Vdd. A control terminal of the switch T10 is coupled to the second terminal of the switch T1. A second terminal of the switch T10 is coupled to the first terminal of the switch T9. A first terminal of the switch T11 is coupled to the second terminal of the switch T10. A control terminal of the switch T11 is configured to receive a bias voltage VB1. The bias voltage VB1 is a stable DC voltage, which can be generated by an internal circuit of the memory chip or supplied from the external of the chip. A second terminal of the switch T11 is coupled to the ground terminal. The circuit shown in FIG. 7 is merely used to illustrate one of the implementation methods of the present disclosure by taking an example, and is not intended to limit the present disclosure. For example, each of the switches T1 to T11 in FIG. 7 may adopt a P-type or an N-type MOSFET depending on practical needs, or some other type of switch may be adopted depending on practical needs.

Figure 8:
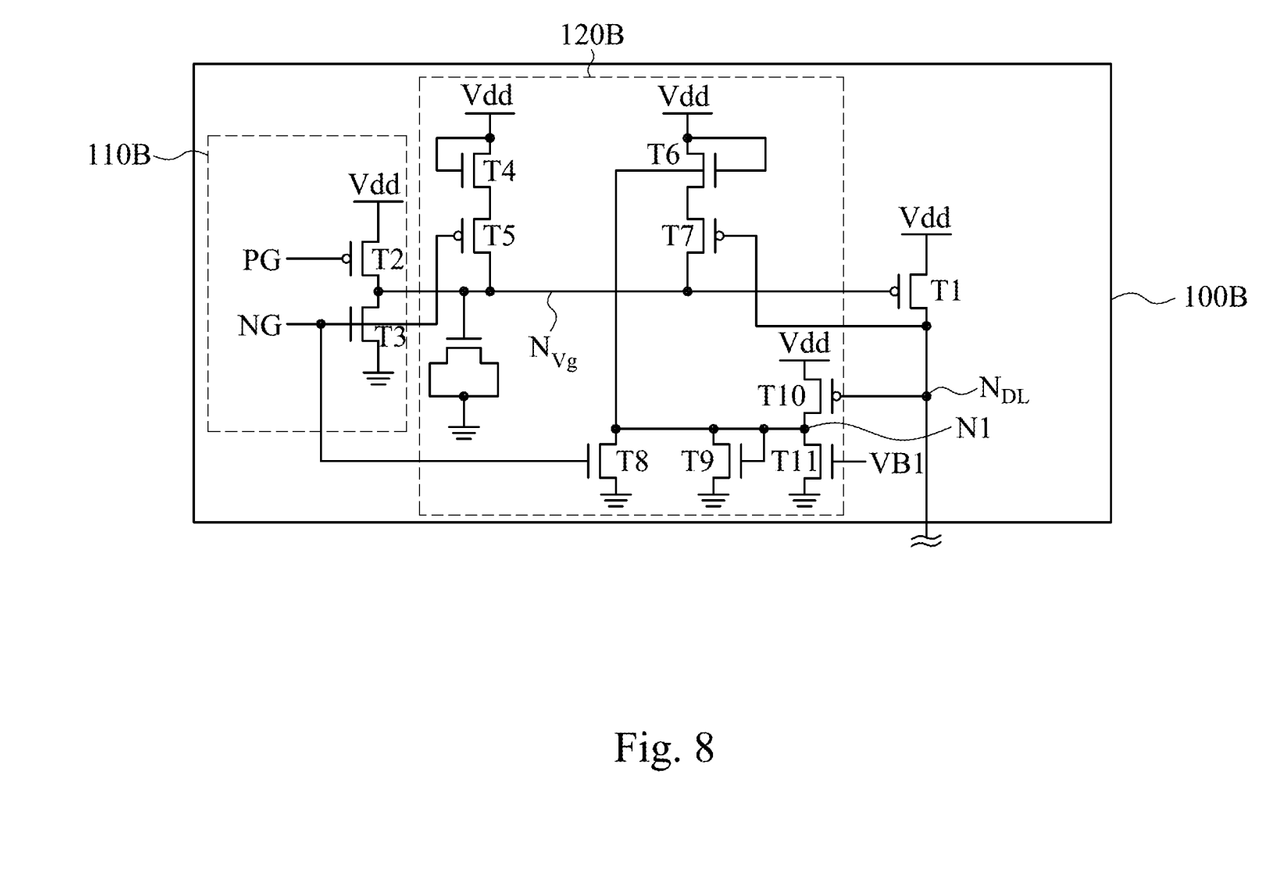
FIG. 8 depicts a schematic diagram of operations of the memory shown in FIG. 7 according to another embodiment of the present disclosure.

FIG. 8 depicts a schematic diagram of operations of the memory shown in FIG. 7 according to another embodiment of the present disclosure. A description is provided with reference to FIG. 4 and FIG. 8 to facilitate understanding. During the period P1, the voltage setting circuit 110B performs setting on the memory array 300. At this time, the signal PG and the signal NG are both at a high level, the switches T2, T5 are thus turned off. The switches T3, T8 are turned on to pull down a voltage at a node NVg, so that a voltage Vg at the node NVg is a low-level voltage. As a result, the switch T1 is completely turned on. A product of a current of the switch T1 that is completely turned on and an internal resistance in the memory unit renders a voltage DL at a node NDL to be at the high level. The switches T7, T10 are thus turned off. The switch T11 is turned on by the high-level bias voltage VB1 so as to pull down a voltage at a node N1. The voltage at the node N1 is at a low level. The switch T9 is therefore turned off. As a result, during the period P1, the switch T3 is turned on to pull down the voltage at the node NVg, and no other power supply voltage Vdd is provided to the node NVg. Accordingly, the voltage Vg at the node NVg is the low-level voltage, and the switch T1 is completely turned on.

Figure 9:
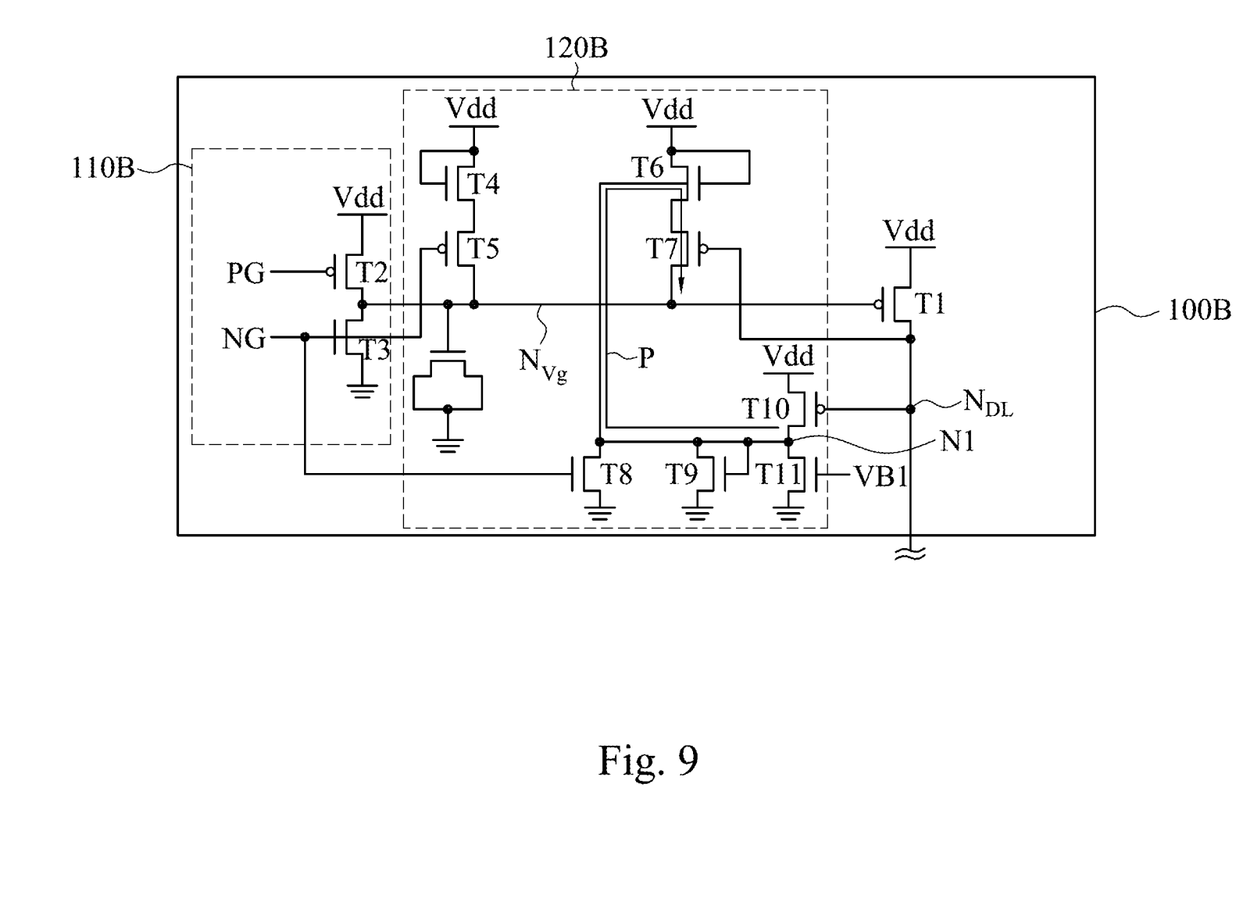
FIG. 9 depicts a schematic diagram of operations of the memory shown in FIG. 7 according to another embodiment of the present disclosure.

FIG. 9 depicts a schematic diagram of operations of the memory shown in FIG. 7 according to another embodiment of the present disclosure. A description is provided with reference to FIG. 4 and FIG. 7 to facilitate understanding. During the period P2, the bias control circuit 120B slowly reduces a voltage/current supplied to the memory array 300 after the memory array 300 is set to avoid that a resistance value of the memory array 300 is pulled up again. At this time, the signal PG is maintained at the high level, and the signal NG turns to be at the low level. The switches T2, T3, T8 are thus turned off. The switch T5 is turned on. The power supply voltage Vdd is supplied to the node NVg through a current path provided by the switches T4, T5. The voltage at the node NVg thus gradually rises. At this time, the switch T1 is gradually turned off to cause the current I1 to gradually decrease and the voltage DL at the node NDL to gradually decrease too. Therefore, the switches T7, T10 are thus gradually turned on. The power supply voltage Vdd is supplied to the node NVg through a current path provided by the switch T7. In addition to that, the power supply voltage Vdd is supplied to the node N1 through a current path provided by the switch T10, so that the voltages at the node NVg and the node N1 gradually rise. In addition, because the voltage at the node N1 gradually rises, another current path P is generated to charge the node NVg when the voltage at node N1 exceeds a threshold voltage of switch T6. As a result, the voltage at the node NVg is increased more rapidly. The switch T1 is therefore gradually turned off more sensitively based on a state of the memory unit, the current I1 is also gradually decreased accordingly.

A description is provided with reference to the voltage waveforms of FIG. 4. The voltage DL at the node NDL is adjusted at any time based on a state of the memory array 300. As a result, the memory drive device 1006 according to the present disclosure can indeed adaptively adjust the voltage/current of the driving operation of each of the memory units based on the characteristics of the each of the memory units.

It is thus understood from the embodiments of the present disclosure that application of the present disclosure has the following advantages. The embodiment according to the present disclosure provides a memory drive device, which can adaptively adjust the voltage/current of the driving operation of each of the phase change memories based on the different characteristics of the each of the phase change memories.

Although the present invention has been described in considerable detail with reference to certain embodiments thereof, other embodiments are possible. Therefore, the spirit and scope of the appended claims should not be limited to the description of the embodiments contained herein.

What is claimed is:

1. A memory drive device, comprising:
   a first switch coupled to a memory unit at a first node;
   a voltage setting circuit coupled to the first switch, the voltage setting circuit providing a setting signal to turn on the first switch during a first period so as to generate a setting current flowing to the memory unit through the first switch;
   a bias control circuit respectively coupled to the first switch and the first node, the bias control circuit continuously detecting a voltage at the first node during a second period, and continuously providing a bias signal to control the first switch so as to adaptively adjust a value of the setting current of the first switch; and
   a configuration setting terminal coupled to the voltage setting circuit and the bias control circuit so as to control the first period and the second period.

2. The memory drive device of claim 1, wherein the voltage setting circuit is enabled and the bias control circuit is disabled during the first period, the voltage setting circuit is disabled and the bias control circuit is enabled during the second period, a value at the configuration setting terminal is controlled so that the second period is immediately after the first period.

3. The memory drive device of claim 1, wherein the bias control circuit comprises:
   a variable resistor element coupled to the first switch and is configured to receive a power supply voltage; and
   a voltage amplifier respectively coupled to the variable resistor element and the first node, and is configured to detect a first voltage generated at the first node to provide a second voltage to the variable resistor element, so as to adjust a resistance value of the variable resistor element to adjust the bias signal correspondingly.

4. The memory drive device of claim 3, wherein the first switch comprises:
   a first terminal configured to receive the power supply voltage;
   a control terminal coupled to the variable resistor element at a second node; and
   a second terminal coupled to the memory unit at the first node;
   wherein the bias control circuit further comprises:
      a resistor coupled between the second node and a ground terminal.

5. The memory drive device of claim 3, wherein the first switch comprises:
   a first terminal configured to receive the power supply voltage;
   a control terminal coupled to the variable resistor element at a second node; and
   a second terminal coupled to the memory unit at the first node;
   wherein the bias control circuit further comprises:
      a capacitor coupled between the second node and a ground terminal.

6. The memory drive device of claim 5, wherein the variable resistor element comprises:
   a second switch, the second switch being in a conducting state;
   a third switch, the third switch and the second switch being connected in series between the power supply voltage and the second node, and the third switch being coupled to the configuration setting terminal;
   a fourth switch, the fourth switch being in the conducting state; and
   a fifth switch, the fifth switch and the fourth switch being connected in series between the power supply voltage and the second node, the second voltage controlling the fifth switch.

7. The memory drive device of claim 6, wherein the voltage amplifier comprises:

a sixth switch, the sixth switch being in the conducting state;
a seventh switch, the seventh switch and the sixth switch being connected in series between the power supply voltage and a ground terminal, a point where the sixth switch and the seventh switch are connected in series forms a third node, and the third node outputting the second voltage;
an eighth switch, the first node controlling the eighth switch; and
a ninth switch being in the conducting state, and the ninth switch and the eighth switch being connected in series between the power supply voltage and the ground terminal, a point where the eighth switch and the ninth switch are connected in series forms a fourth node, and the fourth node controlling the seventh switch.

8. The memory drive device of claim 7, wherein:
the second switch comprises:
  a first terminal configured to receive the power supply voltage;
  a control terminal coupled to the first terminal of the second switch; and
  a second terminal;
the third switch comprises:
  a first terminal coupled to the second terminal of the second switch;
  a control terminal coupled to the configuration setting terminal; and
  a second terminal coupled to the second node;
the fourth switch comprises:
  a first terminal configured to receive the power supply voltage;
  a control terminal; and
  a second terminal coupled to the control terminal of the fourth switch; and
the fifth switch comprises:
  a first terminal coupled to the second terminal of the fourth switch;
  a control terminal coupled to the third node; and
  a second terminal coupled to the second node.

9. The memory drive device of claim 8, wherein:
the sixth switch comprises:
  a first terminal configured to receive the power supply voltage;
  a control terminal configured to receive a first bias voltage; and
  a second terminal;
the seventh switch comprises:
  a first terminal, the first terminal and the second terminal of the sixth switch being coupled at the third node, wherein the third node is coupled to the control terminal of the fifth switch;
  a control terminal; and
  a second terminal coupled to the ground terminal;
the eighth switch comprises:
  a first terminal configured to receive the power supply voltage;
  a control terminal coupled to the first node; and
  a second terminal; and
the ninth switch comprises:
  a first terminal, the first terminal and the second terminal of the eighth switch being coupled at the fourth node, wherein the fourth node is coupled to the control terminal of the seventh switch;
  a control terminal configured to receive a second bias voltage; and
  a second terminal coupled to the ground terminal.

10. The memory drive device of claim 5, wherein the variable resistor element comprises:
  a second switch, the second switch being in a conducting state;
  a third switch, the third switch and the second switch being connected in series between the power supply voltage and the second node, and the third switch being coupled to the configuration setting terminal;
  a fourth switch, the fourth switch being in the conducting state; and
  a fifth switch, the fifth switch and the fourth switch being connected in series between the power supply voltage and the second node, and the first node being coupled to the fifth switch.

11. The memory drive device of claim 6, wherein the voltage amplifier comprises:
  a sixth switch coupled to the configuration setting terminal and the fourth switch;
  a seventh switch, the seventh switch being in the conducting state;
  an eighth switch coupled to the first node; and
  a ninth switch, the ninth switch and the eighth switch being connected in series between the power supply voltage and a ground terminal, and the ninth switch being in the conducting state, wherein a point where the ninth switch and the eighth switch are connected in series forms a third node, and the third node being coupled to the fourth switch, the sixth switch, and the seventh switch.

12. The memory drive device of claim 11, wherein:
the second switch comprises:
  a first terminal configured to receive the power supply voltage;
  a control terminal coupled to the first terminal of the second switch; and
  a second terminal;
the third switch comprises:
  a first terminal coupled to the second terminal of the second switch;
  a control terminal coupled to the configuration setting terminal; and
  a second terminal coupled to the second node;
the fourth switch comprises:
  a first terminal configured to receive the power supply voltage;
  a control terminal coupled to the first terminal of the fourth switch;
  a second terminal; and
  a third terminal coupled to the third node; and
the fifth switch comprises:
  a first terminal coupled to the second terminal of the fourth switch;
  a control terminal coupled to the first node; and
  a second terminal coupled to the second node.

13. The memory drive device of claim 12, wherein:
the sixth switch comprises:
  a first terminal coupled to the third node;
  a control terminal coupled to the configuration setting terminal; and
  a second terminal coupled to the ground terminal;
the seventh switch comprises:
  a first terminal coupled to the third node;
  a control terminal coupled to the third node; and
  a second terminal coupled to the ground terminal;
the eighth switch comprises:
  a first terminal configured to receive the power supply voltage;

a control terminal coupled to the first node; and
a second terminal coupled to the third node; and
the ninth switch comprises:
a first terminal coupled to the third node;
a control terminal configured to receive a bias voltage; and
a second terminal coupled to the ground terminal.

\* \* \* \* \*